US007939943B2

(12) United States Patent
Shiozawa et al.

(10) Patent No.: US 7,939,943 B2
(45) Date of Patent: May 10, 2011

(54) NITRIDE SEMICONDUCTOR DEVICE INCLUDING AN ELECTRODE IN OHMIC CONTACT WITH A P-TYPE NITRIDE SEMICONDUCTOR CONTACT LAYER

(75) Inventors: Katsuomi Shiozawa, Tokyo (JP); Kyozo Kanamoto, Tokyo (JP); Toshiyuki Oishi, Tokyo (JP); Hiroshi Kurokawa, Tokyo (JP); Kenichi Ohtsuka, Tokyo (JP); Yoichiro Tarui, Tokyo (JP); Yasunori Tokuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 127 days.

(21) Appl. No.: 12/268,509

(22) Filed: Nov. 11, 2008

(65) Prior Publication Data

US 2009/0140389 A1    Jun. 4, 2009

(30) Foreign Application Priority Data

Nov. 30, 2007  (JP) ................. 2007-309756

(51) Int. Cl.
  *H01L 23/48* (2006.01)
  *H01L 29/43* (2006.01)
(52) U.S. Cl. . 257/761; 257/249; 257/613; 257/E29.089; 257/E21.09
(58) Field of Classification Search .............. 257/761
  See application file for complete search history.

(56) References Cited

U.S. PATENT DOCUMENTS

| | | | |
|---|---|---|---|
| 2003/0008425 A1 | 1/2003 | Uemura | |
| 2005/0029608 A1* | 2/2005 | Ueda et al. | 257/425 |
| 2007/0210459 A1* | 9/2007 | Burrows et al. | 257/790 |
| 2009/0146308 A1 | 6/2009 | Shiozawa et al. | |
| 2009/0170304 A1 | 7/2009 | Tarui et al. | |

FOREIGN PATENT DOCUMENTS

| | | |
|---|---|---|
| JP | 2000-012899 A | 1/2000 |
| JP | 2002-368272 A | 12/2002 |
| WO | WO 2005069389 A1 * | 7/2005 |

* cited by examiner

*Primary Examiner* — Marcos D Pizarro
*Assistant Examiner* — Raj Gupta
(74) *Attorney, Agent, or Firm* — Leydig, Voit & Mayer, Ltd.

(57) ABSTRACT

A nitride semiconductor device with a p electrode having no resistance between itself and other electrodes, and a method of manufacturing the same are provided. A p electrode is formed of a first Pd film, a Ta film, and a second Pd film, which is an antioxidant film for preventing oxidation of the Ta film, and on a p-type contact layer of a nitride semiconductor. On the second Pd film, a pad electrode is formed. The second Pd film as an antioxidant film is formed on the entire upper surface of the Ta film which forms the p electrode, to prevent oxidation of the Ta film. This inhibits the resistance between the p electrode and the pad electrode, thereby preventing a failure in contact between the p electrode and the pad electrode and providing the low-resistance p electrode.

6 Claims, 5 Drawing Sheets

F I G . 8
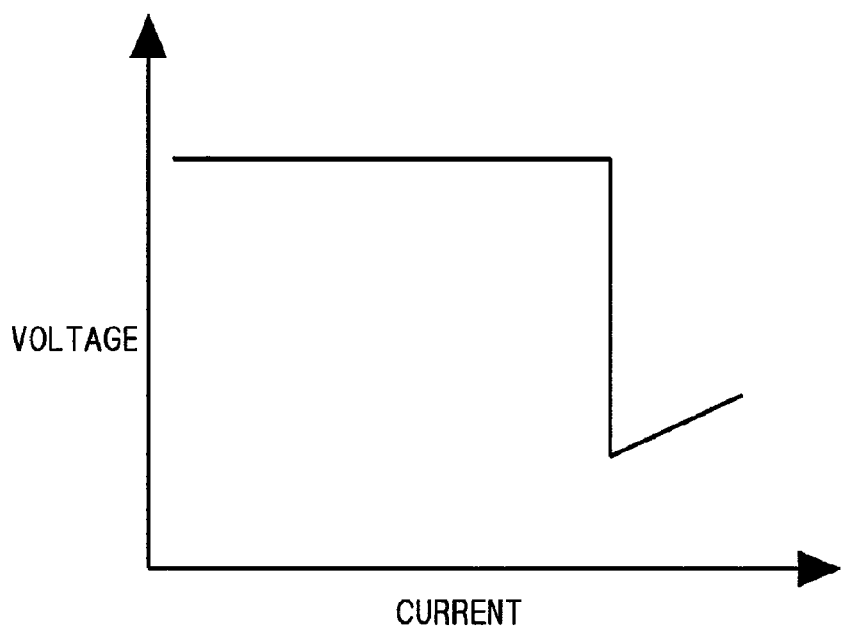
F I G . 9
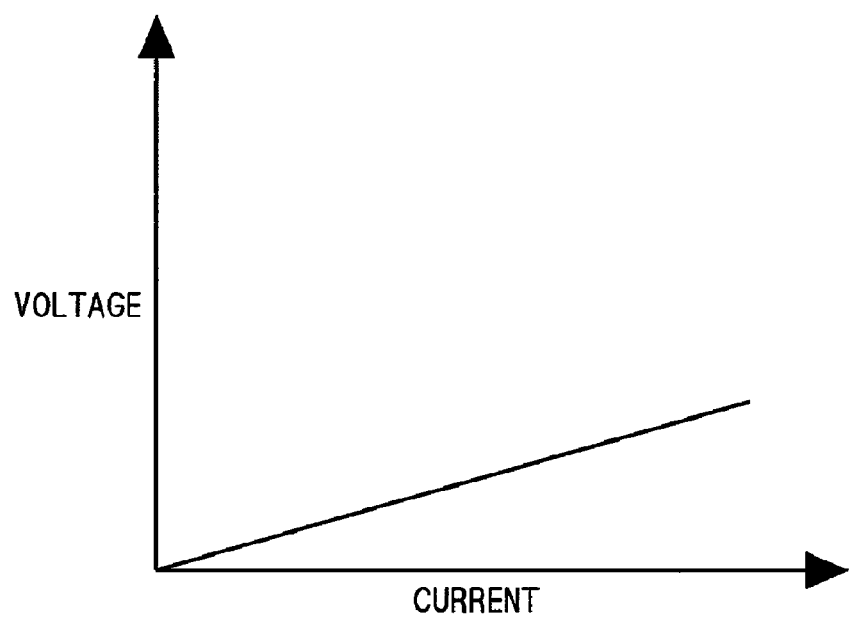

NITRIDE SEMICONDUCTOR DEVICE INCLUDING AN ELECTRODE IN OHMIC CONTACT WITH A P-TYPE NITRIDE SEMICONDUCTOR CONTACT LAYER

BACKGROUND OF THE INVENTION

1. Field of the Invention

The present invention relates to nitride semiconductor devices and methods of manufacturing the same.

2. Description of the Background Art

Conventional nitride semiconductor devices are manufactured by forming and thermally processing a p electrode on a p-type contact layer and then forming a pad electrode on the p electrode (refer to, for example, Japanese Patent Nos. 3427732 and 3765246.)

Performing heat treatment in an atmosphere containing oxygen after the formation of a p electrode, as described above, induces oxidation of the p electrode, resulting in the formation of an oxide film. Forming a pad electrode on this p electrode means that a pad electrode is formed with the oxide film as an insulator present on the p electrode, so that the oxide film can cause a failure in contact between the p electrode and the pad electrode formed thereon.

Such a failure in contact between the p electrode and the pad electrode will increase the resistance between the electrodes, and for example if the nitride semiconductor device is a laser diode, there will occur an increase in the operating voltage of the laser diode and variations in electrical characteristics due to heat generation during operation. This consequently makes it difficult to provide stable operation and output within a specified temperature range. The above resistance can also be a factor in reducing yields.

It is thus desired that connectivity between the p electrode and the pad electrode be improved so as to reduce its influence on device characteristics.

SUMMARY OF THE INVENTION

An object of the invention is to provide nitride semiconductor devices with a p electrode having no resistance between itself and other electrodes, and methods of manufacturing such nitride semiconductor devices.

According to an aspect of the invention, a nitride semiconductor device includes a p-type contact layer, a p electrode, and a pad electrode. The p-type contact layer is formed of a nitride semiconductor. The p electrode is formed of a palladium (Pd) film, a tantalum (Ta) film, and an antioxidant film. The Pd film and the Ta film are formed in order of mention on the p-type contact layer. The antioxidant film is formed on the entire upper surface of the Ta film to prevent oxidation of the Ta film. The pad electrode is formed on the antioxidant film.

The above nitride semiconductor device can prevent a failure in contact between the p electrode and the pad electrode, thereby providing the low-resistance p electrode. It is thus possible, as compared with conventional techniques, to reduce the operating voltage of the nitride semiconductor device and to cut heat generation during operation, thereby allowing high-power and stable operation.

According to another aspect of the invention, a method of manufacturing a nitride semiconductor device includes a p-electrode forming step and a heat-treatment step. In the p-electrode forming step, a palladium (Pd) film and a tantalum (Ta) film are formed in order of mention on a p-type contact layer of a nitride semiconductor, and then, an antioxidant film that prevents oxidation of the Ta film is formed on the entire upper surface of the Ta film, to thereby form a p electrode of the Pd film, the Ta film, and the antioxidant film. In the heat-treatment step, the p electrode formed is thermally processed.

The above method of manufacturing a nitride semiconductor device can prevent a failure in contact between the p electrode and the pad electrode and thereby stabilize the formation of the low-resistance p electrode. It is thus possible, as compared with conventional techniques, to reduce the operating voltage of the nitride semiconductor device and to cut heat generation during operation, thereby providing a nitride semiconductor device that offers high-power and stable operation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a graph illustrating a voltage-current characteristic between a p electrode 12 and a pad electrode 22 when the antioxidant film 15 is formed;

FIG. 9 is a graph illustrating a voltage-current characteristic between the p electrode 12 and the pad electrode 22 when the antioxidant film 15 is not formed;

DESCRIPTION OF THE PREFERRED EMBODIMENTS

First Preferred Embodiment

Figure 1:
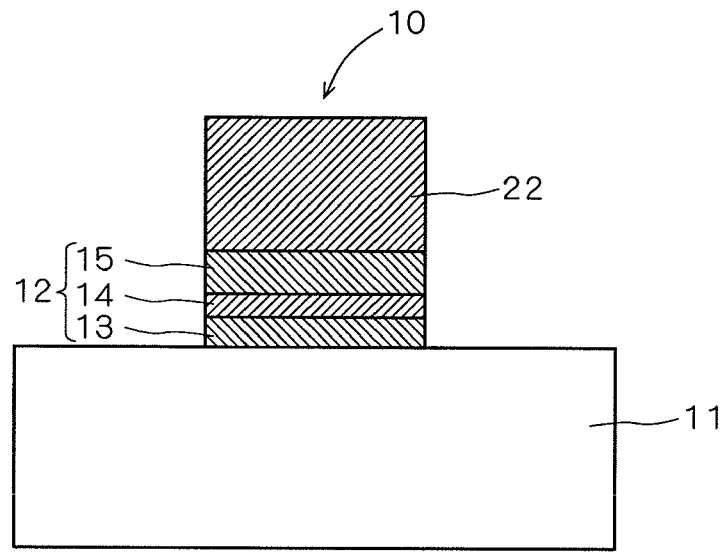
FIG. 1 is a cross-sectional view illustrating the structure of a nitride semiconductor device 10 according to a first preferred embodiment of the invention.

FIG. 1 is a cross-sectional view illustrating the structure of a nitride semiconductor device 10 according to a first preferred embodiment of the invention. The nitride semiconductor device 10 is formed using a gallium nitride (GaN) substrate which is a nitride semiconductor substrate.

In the nitride semiconductor device 10, a p electrode 12 is formed on a p-type contact layer of a nitride semiconductor. The p electrode 12 is formed of a first palladium (Pd) film 13, a tantalum (Ta) film 14, and an antioxidant film 15 that prevents oxidation of the Ta film 14. The first Pd film 13 and the Ta film 14 are formed in order of mention on the p-type contact layer 11. The antioxidant film 15 is formed on the entire upper surface of the Ta film 14. The antioxidant film 15 is formed of a second Pd film. The second Pd film, serving as the antioxidant film 15, is referred to with the same reference numeral, 15, as the antioxidant film in the following preferred embodiments. On the p-type contact layer 11, the first Pd film 13, the Ta film 14, and the second Pd film 15 are formed in order of mention. The p-type contact layer 11 in the present example is p-type $Al_xGa_{1-x}N$ ($0 \leq x \leq 1$).

The first Pd film 13 and the Ta film 14, which form the p electrode 12, each should have a thickness on the order of 10 to 100 nm. The first Pd film 13 is necessary for establishing an ohmic contact with the p-type contact layer 11, and the Ta film 14 is necessary for inhibiting cohesion and promoting ohmic properties of the first Pd film 13 during heat treatment described later. For instance, the first Pd film 13 has a thickness of about 55 nm, and the Ta film 14 has a thickness of about 15 nm. The second Pd film 15, which is an antioxidant film, should have a thickness that prevents oxidation of the Ta film 14, and specifically must have a thickness of 50 nm or more.

In the nitride semiconductor device 10, a pad electrode 22 is formed on the second Pd film 15 which is an antioxidant film. The pad electrode 22 should desirably be made of a material containing titanium (Ti). Specific examples of the material for the pad electrode 22 according to the present preferred embodiment include Ti, Ta, gold (Au), and molybdenum (Mo). Specific examples of the structure of the pad electrode 22 include a Ti/Ta/Ti/Au four-layer structure in which a Ti film, a Ta film, another Ti film, and an Au film are formed in order of mention on the p electrode 12, and a Ti/Mo/Ti/Au four-layer structure in which a Ti film, a Mo film, another Ti film, and an Au film are formed in order of mention on the p electrode 12.

Figure 2:
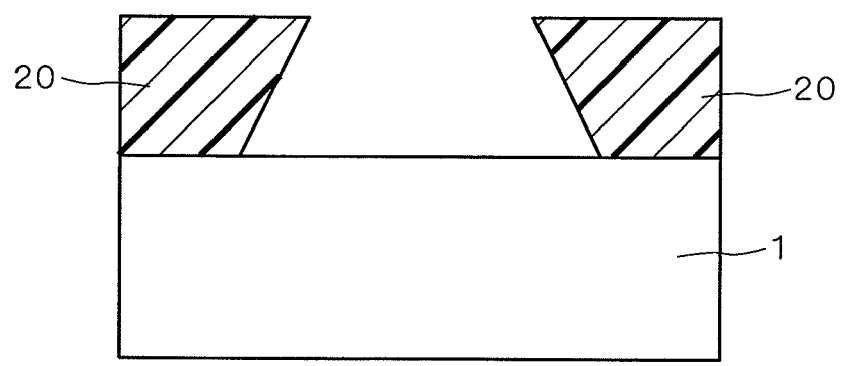
FIGS. 2 to 6 are cross-sectional views illustrating a method of manufacturing the nitride semiconductor device 10 according to the first preferred embodiment of the invention.
Figure 3:
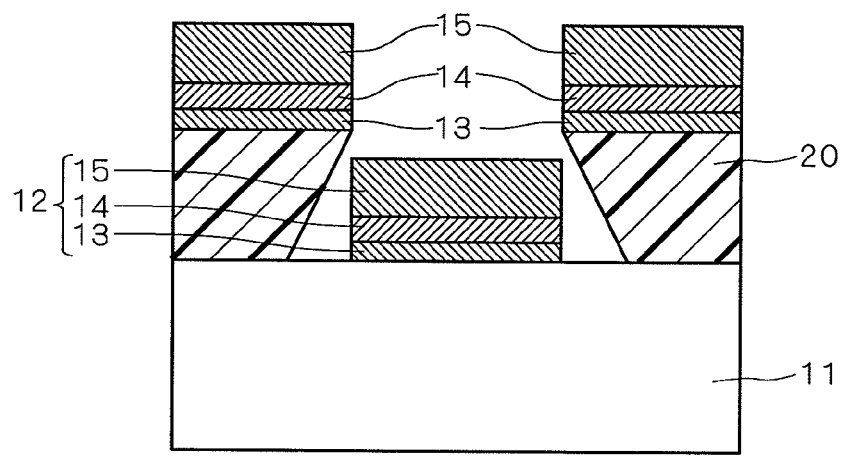
Figure 4:
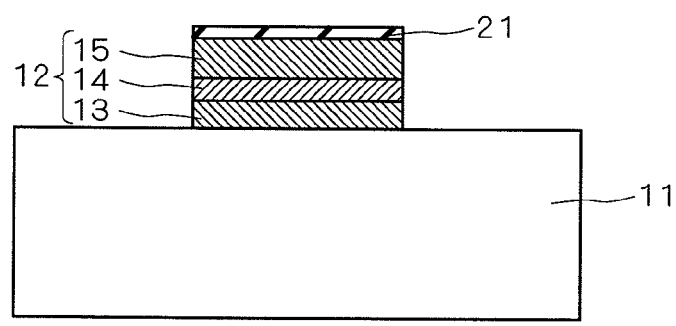

Next, a method of manufacturing the nitride semiconductor device 10 according to the first preferred embodiment of the invention is described. FIGS. 2 to 6 are cross-sectional views illustrating the method of manufacturing the nitride semiconductor device 10 according to the first preferred embodiment of the invention. First, as shown in FIGS. 2 to 4, a material for the p electrode 12 (hereinafter also referred to as a "p-electrode material") is selectively formed on the p-type contact layer 11 by a lift-off method. To be more specific, as shown in FIG. 2, a mask 20 for use in the selective formation of a p-electrode material is firstly formed on the p-type contact layer 11. The mask 20 is formed in all areas on the p-type contact layer 11 other than the area where the p electrode 12 is to be formed (which area is hereinafter also referred to as a "p-electrode forming area"). The mask 20 is formed for example of a resist.

After the formation of the mask 20, as shown in FIG. 3, using electron-beam (EB) evaporation or sputtering techniques, the first Pd film 13, the Ta film 14, and the second Pd film 15 as an antioxidant film, which form the p electrode 12, are formed in order of mention by deposition on the mask 20 and on areas of the p-type contact layer 11 which are not covered with the mask 20, i.e., on the p-electrode forming area.

After the deposition of the first Pd film 13, the Ta film 14, and the second Pd film 15, the mask 20 is removed, as shown in FIG. 4, so that the p-electrode material formed on unnecessary areas, i.e., on the areas other than the p-electrode forming area, is removed together with the mask 20. This allows the p-electrode material to be selectively formed on the p-type contact layer 11. The step of forming the first Pd film 13 and the Ta film 14 in order of mention on the p-type contact layer 11 and then forming the second Pd film 15 which is an antioxidant film on the entire upper surface of the Ta film 14 to thereby form the p electrode 12 of the first Pd film 13, the Ta film 14, and the second Pd film 15 is a p-electrode forming step.

The p electrode 12 formed by the above step is then thermally processed by a heat-treatment step. For desired contact resistance, the heat treatment after the formation of the p electrode 12 is necessary. In the heat-treatment step, it is desirable that the p electrode 12 be thermally processed in a gas atmosphere containing oxygen atoms. The oxygen-atom-containing gas discussed here may, for example, be a gas containing at least one kind of oxygen ($O_2$), ozone ($O_3$), nitrogen monoxide (NO), nitrogen dioxide ($NO_2$), carbon monoxide (CO), carbon dioxide ($CO_2$), and water vapor ($H_2O$), and it may be air. The heat-treatment temperature shall be on the order of 400 to 800° C. and shall be any suitable temperature according to the material structure.

Although the heat treatment in a gas atmosphere containing oxygen atoms, as described above, results in the formation of a Pd oxide film 21 on the second Pd film 15, the second Pd film 15 that covers the entire upper surface of the Ta film 14 forming the p electrode 12 will inhibit oxidation of the Ta film 14 forming the p electrode 12. In other words, forming the second Pd film 15 as an antioxidant film on the entire upper surface of the Ta film 14 forming the p electrode 12 inhibits oxidation of the Ta film 14 forming the p electrode 12, thereby allowing a pad electrode 22 that will have good electrical characteristics even after the heat treatment to be formed on the p electrode 12.

Figure 5:
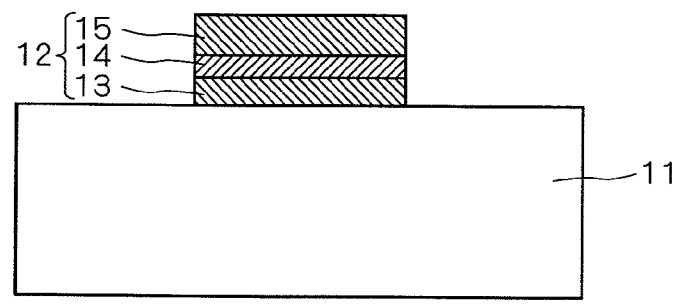

After the heat treatment, in a removal step, the Pd oxide film 21 formed on the surface of the second Pd film 15 is removed as shown in FIG. 5. The removal of the Pd oxide film 21 is done using an acid solution. More specifically, about 10-minute immersion in a hydrochloric acid solution will remove the Pd oxide film 21. The surface of the second Pd film 15 after subjected to the processing using the hydrochloric acid solution will have a similar metallic luster to what it had before the heat treatment. The removal of the Pd oxide film 21 may be performed immediately after the heat treatment, or as an alternative after the formation of a pattern for use in the formation of the pad electrode 22 described later. It is however preferable that the Pd oxide film 21 be removed immediately after the heat treatment because of an increase in flexibility in the process of manufacturing the nitride semiconductor device 10.

For the removal of the Pd oxide film 21, a removal technique using wet etching with a hydrochloric acid solution as described above may be used, or instead, other removal techniques may be used such as the one using dry etching with a halocarbon gas such as carbon tetrafluoride ($CF_4$) or carbon tetrachloride ($CCl_4$).

Figure 6:
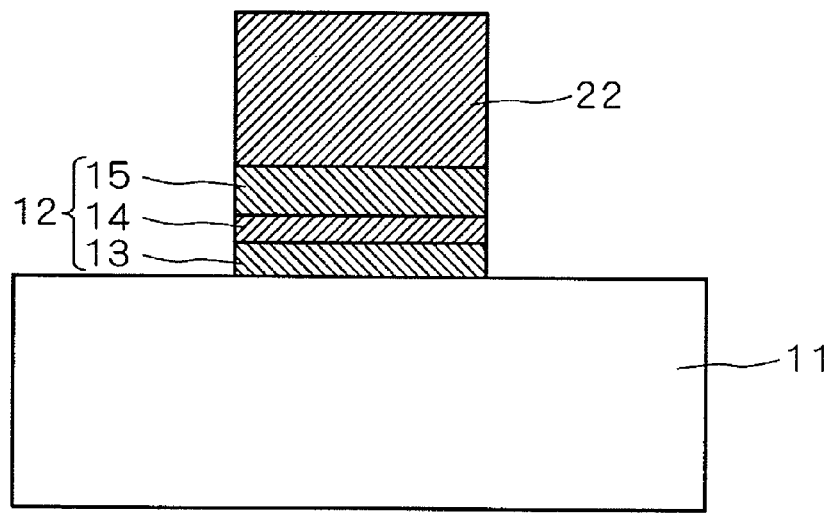

After the removal of the Pd oxide film 21, in a pad-electrode forming step, the pad electrode 22 for use in wire bonding or the like is formed on the p electrode 12, more specifically on the second Pd film 15, as shown in FIG. 6. The pad electrode 22 can be formed by EB evaporation or sputtering in the same way as the formation of the p-electrode material. The thickness of the pad electrode 22 may vary depending on the processing performed after the pad formation.

When the pad electrode 22 is formed by sputtering, it is not always necessary to add the step of removing the Pd oxide film 21 formed on the surface of the second Pd film 15 after the heat treatment. Instead, the Pd oxide film 21 may be removed by reverse sputtering before the formation of the pad electrode 22. Through the process described above, the nitride semiconductor device 10 is manufactured.

Figure 7:
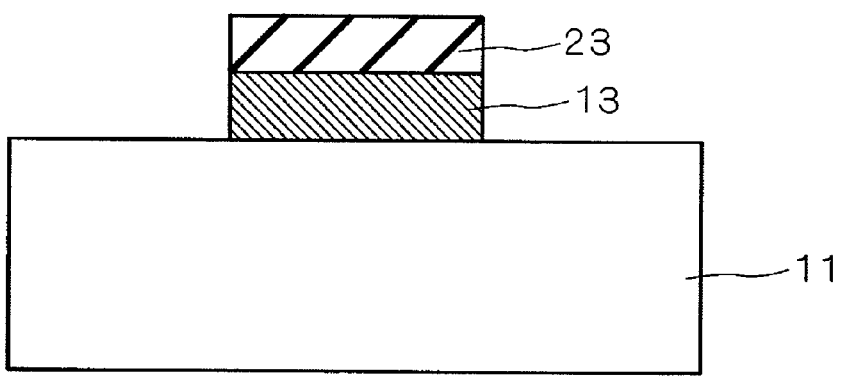
FIG. 7 is a cross-sectional view illustrating the structure of the nitride semiconductor device 10 when the heat treatment is performed without formation of an antioxidant film 15.

Next, the electrical characteristic between the p electrode 12 and the pad electrode 22 is described. FIG. 7 is a cross-sectional view illustrating the structure of the nitride semiconductor device 10 when the heat treatment is performed without formation of the antioxidant film 15. FIG. 8 is a graph showing a voltage-current characteristic between the p electrode 12 and the pad electrode 22 when the antioxidant film 15 is not formed, and FIG. 9 is a graph showing a voltage-current characteristic between the p electrode 12 and the pad electrode 22 in the case of the first preferred embodiment, i.e., when the antioxidant film 15 is formed.

The heat treatment of the first Pd film 13 and the Ta film 14, which form the p electrode 12, in a gas atmosphere containing oxygen atoms causes oxidation of the Ta film 14, resulting in the formation of a Ta oxide film 23. The oxidation of the Ta film 14 at this time occurs not only in the surface of the Ta film 14 but also throughout the Ta film 14. In other words, all the Ta film 14 is oxidized so that, as shown in FIG. 7, the Ta oxide film 23 is formed on the first Pd film 13 so as to cover the entire upper surface of the first Pd film 13.

If, in this condition, the pad electrode 22 is formed on the p electrode, i.e., on the Ta oxide electrode 23, in an effort to produce a current flow between the p electrode 12 and the pad electrode 22, the Ta oxide film 23 formed by the heat treatment will make high resistance so that no current will flow as shown in FIG. 8. That is, the device can have a good electrical characteristic.

In the present preferred embodiment, on the other hand, the second Pd film 15 which is an antioxidant film is formed on the entire upper surface of the Ta film 14 forming the p electrode 12, so that only the surface of the second Pd film 15 is oxidized to form the Pd oxide film 21.

Thus, no high-resistance film, like the Ta oxide film 23 described above, will be formed, so that forming the pad electrode 22 after the removal of the Pd oxide film 21 formed on the surface of the second Pd film 15 will provide low-resistance continuity between the p electrode 12 and the pad electrode 22. The device thus exhibits a linear (ohmic) voltage-current characteristic as shown in FIG. 9, i.e., it can have a good electrical characteristic.

The second Pd film 15 which is an antioxidant film should desirably have a thickness that prevents oxidation of the Ta film 14 and that allows the second Pd film 15 to remain on the Ta film 14 even after the removal of the Pd oxide film 21 formed by oxidation of the surface of the second Pd film 15. To be specific, the second Pd film 15 needs to have a thickness of 50 nm or more. Although an increased thickness of the second Pd film 15 will increase the effect of protection of the Ta film 14 in contact with the second Pd film 15, an excessive increase in the thickness of the second Pd film 15 will make the shape processing or the like difficult in the process of manufacturing a nitride semiconductor device. Thus, the upper limit of the thickness of the second Pd film 15 is on the order of 100 nm.

In the nitride semiconductor device 10 according to the present preferred embodiment, as previously described, the p electrode 12 is formed of the first Pd film 13, the Ta film 14, and the second Pd film 15, which is an antioxidant film that prevents oxidization of the Ta film 14, and on the p-type contact layer 11 of a nitride semiconductor. On the second Pd film 15, the pad electrode 22 is formed. The second Pd film 15 which is an antioxidant film is formed on the entire upper surface of the Ta film 14 forming the p electrode 12 to prevent oxidation of the Ta film 14 forming the p electrode 12, thus inhibiting the resistance between the p electrode 12 and the pad electrode 12.

This prevents a failure in contact between the p electrode 12 and the pad electrode 22, thereby providing the low-resistance p electrode 12. It is thus possible, as compared with the conventional techniques described above, to reduce the operating voltage of the nitride semiconductor device 10 and to cut heat generation during operation, thereby allowing high-power and stable operation.

Also in the nitride semiconductor device 10 according to the present preferred embodiment, the antioxidant film 15 is made of a metal film, specifically, the second Pd film 15. This further inhibits the resistance between the p electrode 12 and the pad electrode 22, thereby preventing a failure in contact between the p electrode 12 and the pad electrode 22 with more reliability and providing the lower-resistance p electrode 12.

Still also in the nitride semiconductor device 10 according to the present preferred embodiment, while the antioxidant film 15 is made of the second Pd film 15, the metal film which is the antioxidant film 15 is not limited to the second Pd film 15 and may be either a nickel (Ni) or titanium (Ti) film. Using a metal film such as a Pd film, a Ni film, or a Ti film as the antioxidant film 15 further inhibits the resistance between the p electrode 12 and the pad electrode 22, as compared with the case of using, as the antioxidant film 15, any metal film other than a Pd film, a Ni film, and a Ti film. This prevents a failure in contact between the p electrode 12 and the pad electrode 22 with more reliability and provides the lower-resistance p electrode 12.

In the method of manufacturing the nitride semiconductor device 10 according to the present preferred embodiment, in the p-electrode forming step, the first Pd film 13 and the Ta film 14 are formed in order of mention on the p-type contact layer 11 of a nitride semiconductor and then the second Pd film 15 as an antioxidant film that prevents oxidation of the Ta film 14 is formed on the entire upper surface of the Ta film 14, to thereby form the p electrode 12 of the first Pd film 13, the Ta film 14, and the second Pd film 15. After this p electrode 12 with the second Pd film 15 formed on the entire upper surface of the Ta film 14 is thermally processed in the heat-treatment step, the pad electrode 22 is formed on the second Pd film 15 forming the p electrode 12 in the pad-electrode forming step.

During the heat treatment of the p electrode 12 in the heat-treatment step, the second Pd film 15 formed as an antioxidant film on the entire upper surface of the Ta film 14 forming the p electrode 12 prevents oxidation of the Ta film 14 by the heat treatment.

This inhibits the resistance between the p electrode 12 and the pad electrode 22, thereby preventing a failure in contact between the p electrode 12 and the pad electrode 22 and stabilizing the formation of the low-resistance p electrode 12. It is thus possible, as compared with the conventional techniques described above, to reduce the operating voltage of the nitride semiconductor device 10 and to cut heat generation during operation, thereby providing the nitride semiconductor device 10 that offers high-power and stable operation.

Also in the method of manufacturing the nitride semiconductor device 10 according to the present preferred embodiment, the heat treatment in a gas atmosphere containing oxygen atoms induces oxidation of the surface of the second Pd film 15 which is an antioxidant film, resulting in the formation of the Pd oxide film 21. According to the present preferred embodiment, the Pd oxide film 21 formed on the surface of the second Pd film 15 is removed in the removal step after the heat-treatment step.

Since the Pd oxide film 21 has lower resistance than the above-described Ta oxide film 23 shown in FIG. 7, the removal of the Pd oxide film 21 is not necessarily required and the pad electrode 22 may be formed with the presence of the Pd oxide film 21. It is however preferable that the pad electrode 22 be formed after the removal of the Pd oxide film 21 as in the present preferred embodiment.

This further inhibits the resistance between the p electrode 12 and the pad electrode 22, thereby preventing a failure in contact between the p electrode 12 and the pad electrode 22 with more reliability and stabilizing the formation of the low-resistance p electrode 12.

Still also in the method of manufacturing the nitride semiconductor device 10 according to the present preferred embodiment, the pad electrode 22 is formed on the second Pd film 15 which is an antioxidant film in the pad-electrode forming step after the heat-treatment step. Since the second Pd film 15 prevents oxidation of the Ta film 14 forming the p electrode 12, the resistance between the p electrode 12 and the pad electrode 22 can be inhibited. This prevents a failure in contact between the p electrode 12 and the pad electrode 22 and stabilizes the formation of the low-resistance p electrode 12. It is thus possible, as compared with the conventional techniques described above, to reduce the operating voltage of the nitride semiconductor device 10 and to cut heat generation during operation, thereby providing the nitride semiconductor device 10 that offers high-power and stable operation.

Still also in the method of manufacturing the nitride semiconductor device 10 according to the present preferred embodiment, the p electrode 12 is thermally processed in a gas atmosphere containing oxygen atoms in the heat-treatment step. This makes a more reliable ohmic contact between the p electrode 12 and the p-type contact layer 11, thus providing the p electrode 12 with reduced contact resistance. Since the p electrode 12 is thermally processed with the second Pd film 15 which is an antioxidant film formed on the entire upper surface of the Ta film 14 forming the p electrode 12, the Ta film 14 forming the p electrode 12 can be prevented from being oxidized during the heat-treatment step.

This inhibits the resistance between the p electrode 12 and the pad electrode 22, thereby preventing a failure in contact between the p electrode 12 and the pad electrode 22 and stabilizing the formation of the low-resistance p electrode 12.

Still also in the method of manufacturing the nitride semiconductor device 10 according to the present preferred embodiment, the oxygen-atom-containing gas for use in the heat treatment of the p electrode 12 is at least one kind of oxygen ($O_2$), ozone ($O_3$), nitrogen monoxide (NO), nitrogen dioxide ($NO_2$), carbon monoxide (CO), carbon dioxide ($CO_2$), and water vapor ($H_2O$). This achieves a more reliable ohmic contact between the p electrode 12 and the p-type contact layer 11 and allows the formation of the p electrode 12 with reduced contact resistance.

Still also in the method of manufacturing the nitride semiconductor device 10 according to the present preferred embodiment, an oxide film formed by oxidation of the surface of the antioxidant film 15 is removed by etching in the removal step. This inhibits the resistance between the p electrode 12 and the pad electrode 22 with more reliability, thus preventing a failure in contact between the p electrode 12 and the pad electrode 22 with more reliability and stabilizing the formation of the low-resistance p electrode 12.

Still also in the method of manufacturing the nitride semiconductor device 10 according to the present preferred embodiment, although the surface of the antioxidant film 15, more specifically an oxide film formed by oxidation of that surface, is removed by etching in the removal step, the invention is not limited thereto. For instance, the oxide film may be removed by reverse sputtering, and then in the subsequent pad-electrode forming step, the pad electrode 22 may be formed by sputtering on the antioxidant film 15.

In that case, the oxide film can be removed by a sputtering apparatus before the formation of the pad electrode 22, which makes the removal of the oxide film easy. In other words, the removal step may be either separated from the pad-electrode forming step as an etching step as in the case of the present preferred embodiment or included in the pad-electrode forming step.

When the process for manufacturing the nitride semiconductor device 10 includes a surface-cleaning step for cleaning the surface of the nitride semiconductor device 10, it may be possible to remove the surface of the antioxidant film 15 by this surface-cleaning step. In such a case, it is unnecessary to add the removal step because the surface-cleaning step will serve as a removal step.

Second Preferred Embodiment

Figure 10:
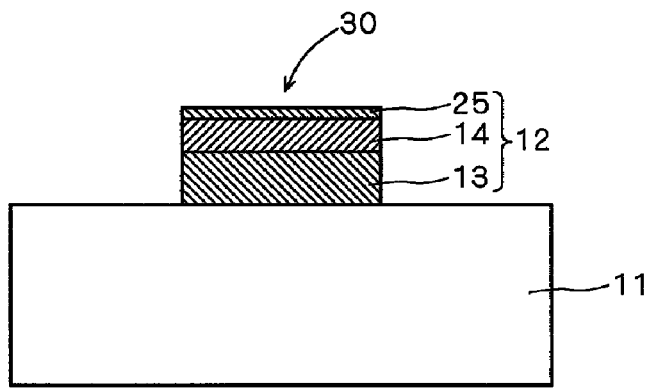
FIG. 10 is a cross-sectional view illustrating the structure of a nitride semiconductor device 30 according to a second preferred embodiment of the invention.

FIG. 10 is a cross-sectional view illustrating the structure of a nitride semiconductor device 30 according to a second preferred embodiment of the invention. The nitride semiconductor device 30 is formed using a GaN substrate which is a nitride semiconductor substrate.

The nitride semiconductor device 30 is similar in structure to the above-described nitride semiconductor device 10 according to the first preferred embodiment and differs only in that, instead of the second Pd film 15, an alloy layer of Ta and Si (hereinafter also referred to as a "Ta—Si alloy layer") 25 is formed on the entire upper surface of the Ta film 14 forming the p electrode 12. The description is thus given only of the differences of the present preferred embodiment from the aforementioned first preferred embodiment, and corresponding parts are referred to by the same reference numerals to avoid a repetitive description of the common parts.

In the nitride semiconductor device 30, the p electrode 12 is formed on the p-type contact layer 11 of a nitride semiconductor. The p electrode 12 according to the present preferred embodiment is formed of the first Pd film 13, the Ta film 14, and the Ta—Si alloy layer 25. The first Pd film 13, the Ta film 14, and the Ta—Si alloy layer 25 are formed in order of mention on the p-type contact layer 11. The Ta—Si alloy layer 25 is formed on the entire upper surface of the Ta film 14, serving as an antioxidant film that prevents oxidation of the Ta film 14. The p-type contact layer 11 in the present example is p-type $Al_xGa_{1-x}N$ ($0 \leq x \leq 1$).

A method of manufacturing the nitride semiconductor device 30 with such a structure is similar in the aforementioned method of manufacturing the nitride semiconductor 10 according to the first preferred embodiment shown in FIGS. 2 to 6, and differs only in that, instead of the second Pd film 15, a silicon (Si) film which will be the Ta—Si alloy layer 25 is formed on the entire upper surface of the Ta film 14 forming the p electrode 12. The description is thus given only of the differences of the present preferred embodiment from the aforementioned first preferred embodiment, and corresponding parts are referred to by the same reference numerals to avoid a repetitive description of the common parts.

A method of forming a Si film on the entire upper surface of the Ta film 14 forming the p electrode 12 may be vapor disposition of Si. After such formation of the Si film on the entire upper surface of the Ta film 14, heat treatment is performed in a gas atmosphere containing oxygen atoms, by which the surface of the Si film will be oxidized but the Ta film 14 will not be oxidized.

During the heat treatment, the Ta film 14 and the Si film react with each other to form the Ta—Si alloy layer 25. Ta has a resistivity of 13 μΩcm and Si has a resistivity of 500 μΩcm. If the Si film formed on the entire upper surface of the Ta film 14 remains as it is, it will serve as resistance; however, if the Ta—Si alloy layer 25 is formed by the heat treatment, the resistance of the Si film will be reduced to about 30 μΩcm, which reduces the possibility that the Si film will serve as resistance.

An Si oxide film formed on the surface of the Si film can be removed by wet etching using a hydrofluoric acid solution or dry etching using a halocarbon gas such as $CF_4$, either of which can be selected according to the manufacturing process.

In the nitride semiconductor device 30 according to the present preferred embodiment, the antioxidant film is formed of a semiconductor film or an insulation film including a semiconductor. This further inhibits the resistance between the p electrode 12 and the pad electrode 22, thus preventing a failure in contact between the p electrode 12 and the pad electrode 22 formed on the Ta—Si alloy layer 25 with more reliability and providing the lower-resistance p electrode 12.

In the nitride semiconductor device 30 according to the present preferred embodiment, the antioxidant film may be any one of a silicon (Si) film, a silicon oxide film ($SiO_2$), a silicon nitride film (SiN), an oxynitride (SiON) film, a germanium (Ge) film, and a germanium monoxide (GeO) film. The Si film and the Ge film are semiconductor films; and the $SiO_2$ film, the SiN film, the SiON film, and the GeO film are insulation films including a semiconductor.

This further inhibits the resistance between the p electrode 12 and the pad electrode 22, as compared with the case where the antioxidant film is any other semiconductor film or any other insulation film including a semiconductor, thus preventing a failure in contact between the p electrode 12 and the pad electrode 22 with more reliability and providing the lower-resistance p electrode 12.

The antioxidant film may be a combination of one of those semiconductors and their insulator. For instance, the lower part of the antioxidant film (on the side of the p electrode 12) may be Si and the upper part thereof may be a silicon insulator, i.e., Si+SiN, in which case the functions are clearly shared between the upper and lower parts: the lower part having the function of forming an alloy layer with the Ta film 14 forming the p electrode 12; and the upper part having the function of preventing oxidation.

Figure 11:
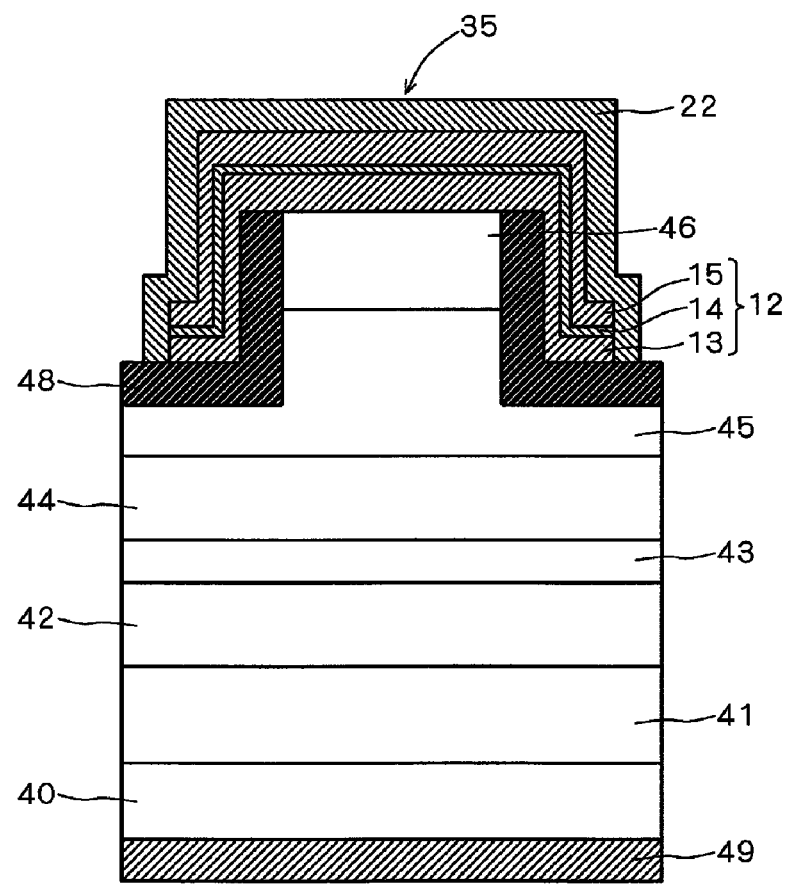
FIG. 11 is a cross-sectional view illustrating the structure of a light-emitting nitride semiconductor device 35.

Next described is a light-emitting nitride semiconductor device 35 that applies the nitride semiconductor devices 10 and 30 according to the aforementioned first and second preferred embodiments. FIG. 11 is a cross-sectional view illustrating the structure of the light-emitting nitride semiconductor device 35. The light-emitting nitride semiconductor device 35 is formed using an n-type gallium nitride (GaN) substrate 40 which is a nitride semiconductor substrate.

A layered structure of nitride semiconductors is formed on the n-type GaN substrate 40. More specifically, an n-type AlGaN clad layer 41, an n-type GaN guide layer 42, an active layer 43, a p-type GaN guide layer 44, a p-type AlGaN clad layer 45, and a p-type GaN contact layer 46 are formed in order of mention on the n-type GaN substrate 40.

The n-type GaN substrate 40 and the layered structure form a laser diode element (nitride semiconductor element). The p electrode 12 is formed on the p-type GaN contact layer 46 which is equivalent to the p-type contact layer 11 according to the aforementioned first and second preferred embodiments, and the pad electrode 22 is formed on this p electrode. The p-type AlGaN clad layer 45 and the p-type GaN contact layer 46 are patterned into a given shape by etching. The p electrode 12 is formed of the first Pd film 13, the Ta film 14, and the second Pd film 15. The first Pd film 13, the Ta film 14, and the second Pd film 15 are formed in order of mention on the p-type GaN contact layer 46. The second Pd film 15 is an antioxidant film and is formed on the entire upper surface of the Ta film 14 to prevent oxidation of the Ta film 14. An $SiO_2$ film 48 is formed as a protective film on a part of the surface of the p-type AlGaN clad layer 45. Further, an n electrode 49 is provided as a metal electrode on the underside of the n-type GaN substrate 40.

In the light-emitting nitride semiconductor device 35, since the second Pd film 15 as an antioxidant film that prevents oxidation of the Ta film 14 is formed on the entire upper surface of the Ta film 14 forming the p electrode 12, oxidation of the Ta film 14 is prevented during the heat treatment after the formation of the p electrode 12. This inhibits the resistance between the p electrode 12 and the pad electrode 22, thus preventing a failure in contact between the p electrode 12 and the pad electrode 22 and providing the low-resistance p electrode 12. It is thus possible, as compared with the conventional techniques described above, to reduce the operating voltage of the light-emitting nitride semiconductor device 35 and to cut heat generation during operation, thereby allowing high-power and stable operation.

While the invention has been shown and described in detail, the foregoing description is in all aspects illustrative and not restrictive. It is therefore understood that numerous modifications and variations can be devised without departing from the scope of the invention.

What is claimed is:

1. A nitride semiconductor device comprising:
   a p-type nitride semiconductor contact layer;
   an electrode in physical contact with the p-type nitride semiconductor contact layer and consisting of, sequentially arranged, a palladium film, a tantalum film, and an oxidation preventing film, wherein the oxidation preventing film completely covers the tantalum film and prevents oxidation of the tantalum film; and
   a pad electrode disposed on and contacting the oxidation preventing film, wherein the oxidation preventing film is a metal selected from the group consisting of palladium, nickel, and titanium.

2. A nitride semiconductor device comprising:
   a p-type nitride semiconductor contact layer;
   an electrode in physical contact with the p-type nitride semiconductor contact layer and consisting of, sequentially arranged, a palladium film, a tantalum film, and an oxidation preventing film, wherein the oxidation preventing film completely covers the tantalum film and prevents oxidation of the tantalum film; and
   a pad electrode disposed on and contacting the oxidation preventing film, wherein the oxidation preventing film is selected from the group consisting of silicon and a compound electrical insulator including an elemental semiconductor as a principal constituent.

3. The nitride semiconductor device according to claim 2, wherein the oxidation preventing film is selected from the group consisting of silicon dioxide, silicon nitride, silicon oxynitride, and germanium monoxide.

4. A nitride semiconductor device comprising:
   a p-type nitride semiconductor contact layer;
   an electrode in physical contact with the p-type nitride semiconductor contact layer and comprising a palladium film in physical contact with the p-type nitride semiconductor contact layer, a tantalum film in physical contact with the palladium film, and an oxidation preventing film in physical contact with the tantalum film, wherein the oxidation preventing film completely covers the tantalum film and prevents oxidation of the tantalum film; and
   a pad electrode disposed on and contacting the oxidation preventing film, wherein the oxidation preventing film is a metal selected from the group consisting of palladium, nickel, and titanium.

5. A nitride semiconductor device comprising:
   a p-type nitride semiconductor contact layer;
   an electrode in physical contact with the p-type nitride semiconductor contact layer and comprising a palladium film in physical contact with the p-type nitride semiconductor contact layer, a tantalum film in physical contact with the palladium film, and an oxidation preventing film in physical contact with the tantalum film, wherein the oxidation preventing film completely covers the tantalum film and prevents oxidation of the tantalum film; and a pad electrode disposed on and contacting the oxidation preventing film, wherein the oxidation preventing film is selected from the group consisting of silicon and a compound electrical insulator including an elemental semiconductor as a principal constituent.

6. The nitride semiconductor device according to claim 5, wherein the oxidation preventing film is selected from the group consisting of silicon dioxide, silicon nitride, silicon oxynitride, and germanium monoxide.

* * * * *